(12) United States Patent
Nishioka

(10) Patent No.: US 7,031,207 B2
(45) Date of Patent: Apr. 18, 2006

(54) SEMICONDUCTOR MEMORY DEVICE WITH CONFIGURABLE ON-CHIP DELAY CIRCUIT

(75) Inventor: Naotoshi Nishioka, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 31 days.

(21) Appl. No.: 10/829,523

(22) Filed: Apr. 22, 2004

(65) Prior Publication Data

US 2004/0218430 A1    Nov. 4, 2004

(30) Foreign Application Priority Data

Apr. 30, 2003   (JP)   ............................. 2003-125362

(51) Int. Cl.
*G11C 7/00*   (2006.01)
(52) U.S. Cl. .................. 365/194; 365/205; 365/189.11
(58) Field of Classification Search ................ 365/194, 365/189.11, 205
See application file for complete search history.

(56) References Cited

U.S. PATENT DOCUMENTS 6,449,204 B1 *   9/2002   Arimoto et al. ............ 365/194

6,563,759 B1 *   5/2003   Yahata et al. ................ 365/233
2002/0003747 A1   1/2002   Yahata
2002/0097623 A1   7/2002   Suzuki

FOREIGN PATENT DOCUMENTS

JP         8123838       5/1996

* cited by examiner

*Primary Examiner*—Huan Hoang

(74) *Attorney, Agent, or Firm*—Pillsbury Winthrop Shaw Pittman LLP

(57) ABSTRACT

A semiconductor memory device has an array of memory cells for memorizing data, an address circuit responsive to an address signal for addressing a memory cell in the array, and a write circuit responsive to a write signal for writing the data into the addressed memory cell. A control circuit is provided for delaying an input timing of the write signal to the write circuit by a given delay amount so as to adjust a timing of writing the data after addressing the memory cell. The control circuit has a register and a variable delay. The register is capable of registering control data for setting the delay amount. The variable delay is provided for delaying the write signal by the set delay amount and outputting the delayed write signal to the write circuit.

10 Claims, 7 Drawing Sheets

FIG. 7
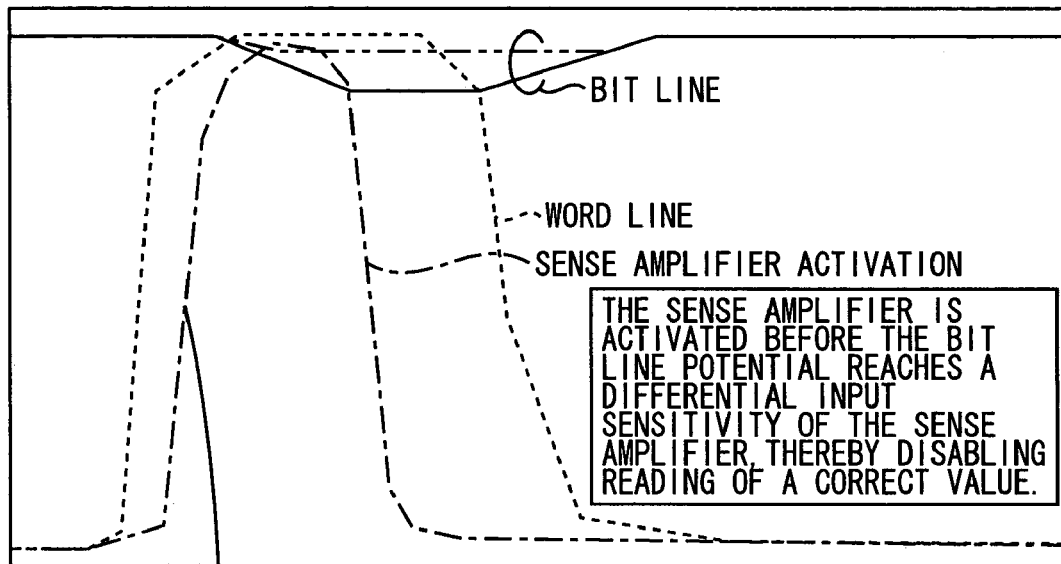
(a)
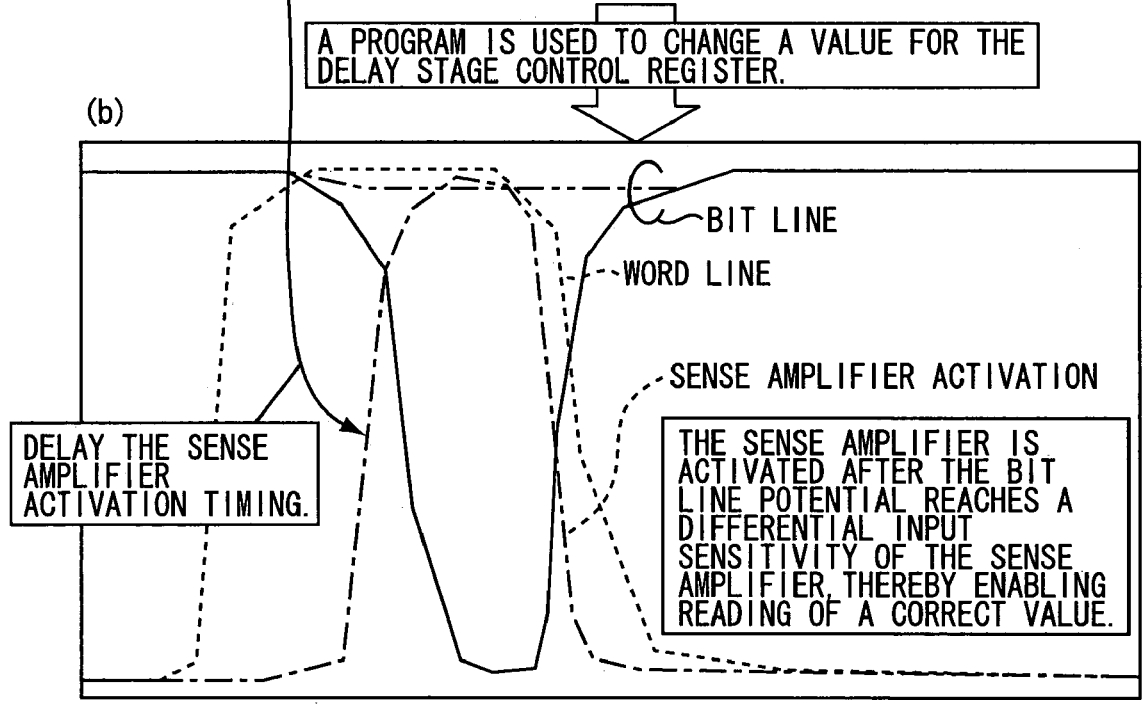
(b)

SEMICONDUCTOR MEMORY DEVICE WITH CONFIGURABLE ON-CHIP DELAY CIRCUIT

BACKGROUND OF THE INVENTION

1. Technical Field of the Invention

The present invention relates to a semiconductor memory device capable of changing access timings after completion of a semiconductor chip.

2. Prior Art

A semiconductor memory device is produced in the form of a semiconductor LSI and comprises an array of memory cells and an internal control circuit. The memory cell array stores data. The control circuit writes data to each memory cell or reads data from each memory cell in the memory cell array. Generally, a delay circuit is integrated in the memory LSI in the form of a gate delay to control or adjust access timing of the memory cell array. Basically, a semiconductor memory device designer adjusts the number of gate stages to optimize access timing by means of simulation using device parameters.

Patent document 1 describes the memory design technology capable of setting desired delay times in accordance with memory cell array configurations and capacities. Further, patent documents 2 and 3 also describe the similar technologies.

Patent document 1 is Japanese Patent Unexamined Publication No. Hei. 08-123838. Patent document 2 is Japanese Patent Unexamined Publication No. 2002-25255, and Patent document 3 is Japanese Patent Unexamined Publication No. 2002-216481.

When the most recently developed process is used or chip dimensions are reduced, however, a large difference occurs between a simulation result and actual chip characteristics, often causing an access error of the memory array due to improper setting of the delay stages. In such case, the chips having the access error must be assumed to be rejected. On the other hand, some delay circuits are capable of physically changing the number of delay stages. The method of changing the number of delay stages is performed by dissolving a resin covering the LSI with chemicals and the like to expose the surface of LSI, and then directly cutting and pasting metal wires by using FIB (Focused Ion Beam) or other apparatuses. Accordingly, this method is not practical and only usable for error analysis. The defective chips cannot be saved as acceptable products according to such a method.

SUMMARY OF THE INVENTION

The present invention has been made in consideration of the foregoing. It is therefore an object of the present invention to provide a semiconductor memory device capable of changing access timings of memory cell arrays subject to access errors after completing fabrication of a semiconductor chip, thereby repairing rejected chips so as to be provided as acceptable products.

The present invention has been made to achieve the above-mentioned objects. The present invention provides a semiconductor memory device comprising an array of memory cells that is provided for memorizing data, an address circuit responsive to an address signal inputted from an outside for addressing a memory cell in the array, a write circuit responsive to a write signal inputted from an outside for writing the data into the addressed memory cell, and a control circuit that is provided for delaying an input timing of the write signal to the write circuit by a given delay amount so as to adjust a timing of writing the data after addressing the memory cell, wherein the control circuit comprises a register capable of registering control data from an outside for setting the delay amount, and a delay circuit for delaying the write signal by the set delay amount and outputting the delayed write signal to the write circuit.

Preferably, the control circuit further comprises another register capable of registering control data from an outside for determining an assertion duration of the write signal, and an assertion setting circuit for setting the assertion duration of the write signal according to the registered control data so that the write circuit is activated for writing the data during the set assertion duration.

Preferably, the delay circuit comprises a plurality of delay lines, each delay line comprising a different number of amplifiers connected in series to define a different delay amount, and a selector for selecting one of the delay lines according to the registered control data so that the selected delay line is used to delay the write signal.

The present invention also provides a semiconductor memory device comprising an array of memory cells that memorizes data, an address circuit responsive to an address signal inputted from an outside for addressing a memory cell in the array, a read circuit responsive to a read signal inputted from an outside for reading the data from the addressed memory cell, and a control circuit that is provided for delaying an input timing of the read signal to the read circuit by a given delay amount so as to adjust a timing of reading the data after addressing the memory cell, wherein the control circuit comprises a register capable of registering control data from an outside for setting the delay amount, and a delay circuit for delaying the read signal by the set delay amount and outputting the delayed read signal to the read circuit.

Preferably, the control circuit further comprises another register capable of registering control data from an outside for determining an assertion duration of the read signal, and an assertion setting circuit for setting the assertion duration of the read signal according to the registered control data so that the read circuit is activated for reading the data during the set assertion duration.

Preferably, the delay circuit comprises a plurality of delay lines, each delay line comprising a different number of amplifiers connected in series to define a different delay amount, and a selector for selecting one of the delay lines according to the registered control data so that the selected delay line is used to delay the read signal.

Preferably, the control circuit comprises an OR gate circuit, an AND gate circuit and variable delay circuits including a first delay circuit, a second delay circuit and a third delay circuit. The first delay circuit initially delays the read signal and outputs the initially delayed read signal as a word signal for the memory cell. The second delay circuit is connected in series to the first delay circuit for subsequently delaying the initially delayed read signal and outputting the subsequently delayed read signal. The OR gate circuit has an input terminal for receiving the read signal, another input terminal for receiving the subsequently delayed read signal, and an output terminal for feeding an OR-gated read signal as a precharge signal to the memory cell. The AND gate circuit has an input terminal for receiving the read signal, another input terminal for receiving the subsequently delayed read signal and an output terminal for feeding an AND-gated read signal having a given assertion duration such that the AND gate circuit, the first delay circuit and the second delay circuit constitute an assertion setting circuit for setting the assertion duration of the read signal so that the read circuit is activated for reading the data during the assertion duration. The third delay circuit is connected to the output terminal of the AND gate circuit for finally delaying the AND-gated read signal by the set delay amount such that the third delay circuit constitutes the delay circuit for delaying the read signal by the set delay amount and outputting the finally delayed read signal to the read circuit.

The present invention further provides a control method of a semiconductor memory device having an array of memory cells for memorizing data, an address circuit responsive to an address signal inputted from an outside for addressing a memory cell in the array, and a write circuit responsive to a write signal inputted from an outside for writing the data into the addressed memory cell. The control method comprises the steps of registering control data into an internal register from an outside for setting an optimal delay amount, setting the optimal delay amount to an internal delay circuit according to the registered control data, and outputting the write signal delayed by the set delay amount from the internal delay circuit to the write circuit so as to adjust a timing of writing the data after addressing the memory cell.

BRIEF DESCRIPTION OF THE DRAWINGS

FIG. 7 shows effects of the embodiment.

DETAILED DESCRIPTION OF THE INVENTION

Figure 1:
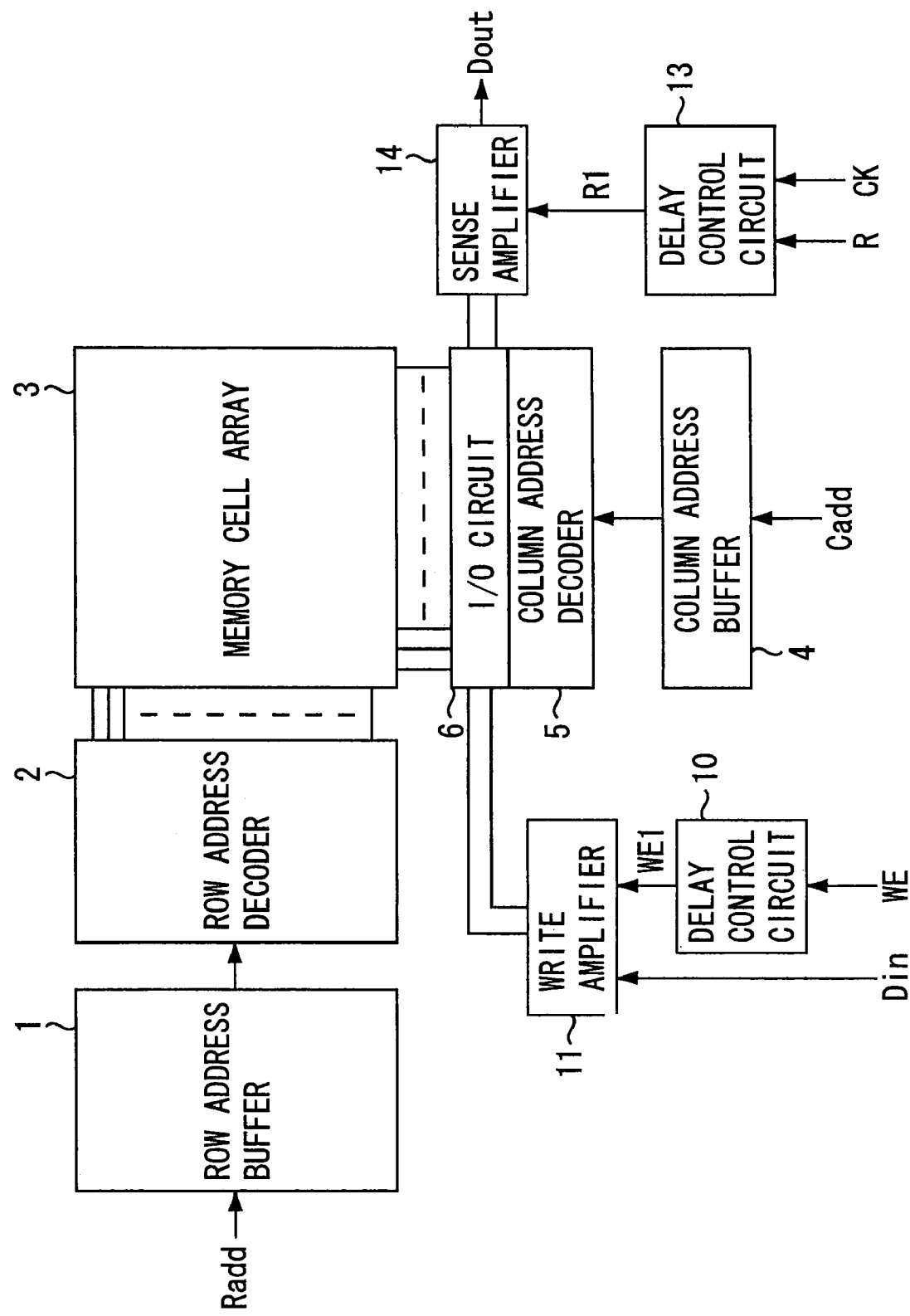
FIG. 1 is a block diagram showing an entire configuration of a semiconductor memory device according to an embodiment of the present invention.

Embodiments of the present invention will be described in further detail with reference to the accompanying drawings. FIG. 1 is a block diagram showing a configuration of a semiconductor memory device according to an embodiment of the present invention. In FIG. 1, the reference numeral 1 represents a row address buffer to temporarily store row address Radd, 2 a row address decoder to decode output from the row address buffer 1, and 3 a memory cell array. An output from the row address decoder 2 drives a word line of the memory cell array 3. The row address buffer 1 and row address decoder 2 constitute a part of an address circuit. The reference numeral 4 represents a column address buffer to temporarily store column address Cadd and 5 a column address decoder to decode output from the column address buffer 4. An output from the column address decoder 5 drives a bit line of the memory cell array 3. The column address buffer 4 and column address decoder 5 constitute another part of the address circuit.

The reference numeral 10 represents an internal delay control circuit to delay a write signal WE for a specified time period, i.e., delay amount. The reference numeral 11 represents a write amplifier that becomes active in response to output signal WE1 from the delay control circuit 10. The write amplifier 11 constitutes a write circuit and amplifies write data Din and outputs it to the memory cell array 3 via an I/O circuit 6. The reference numeral 13 represents a delay control circuit to delay read signal R for a specified time period. The reference numeral 14 represents a sense amplifier that becomes active in response to output signal R1 from the delay control circuit 13. The sense amplifier 14 constitutes a part of a read circuit, and amplifies and outputs data read from the memory cell array 3.

Figure 2:
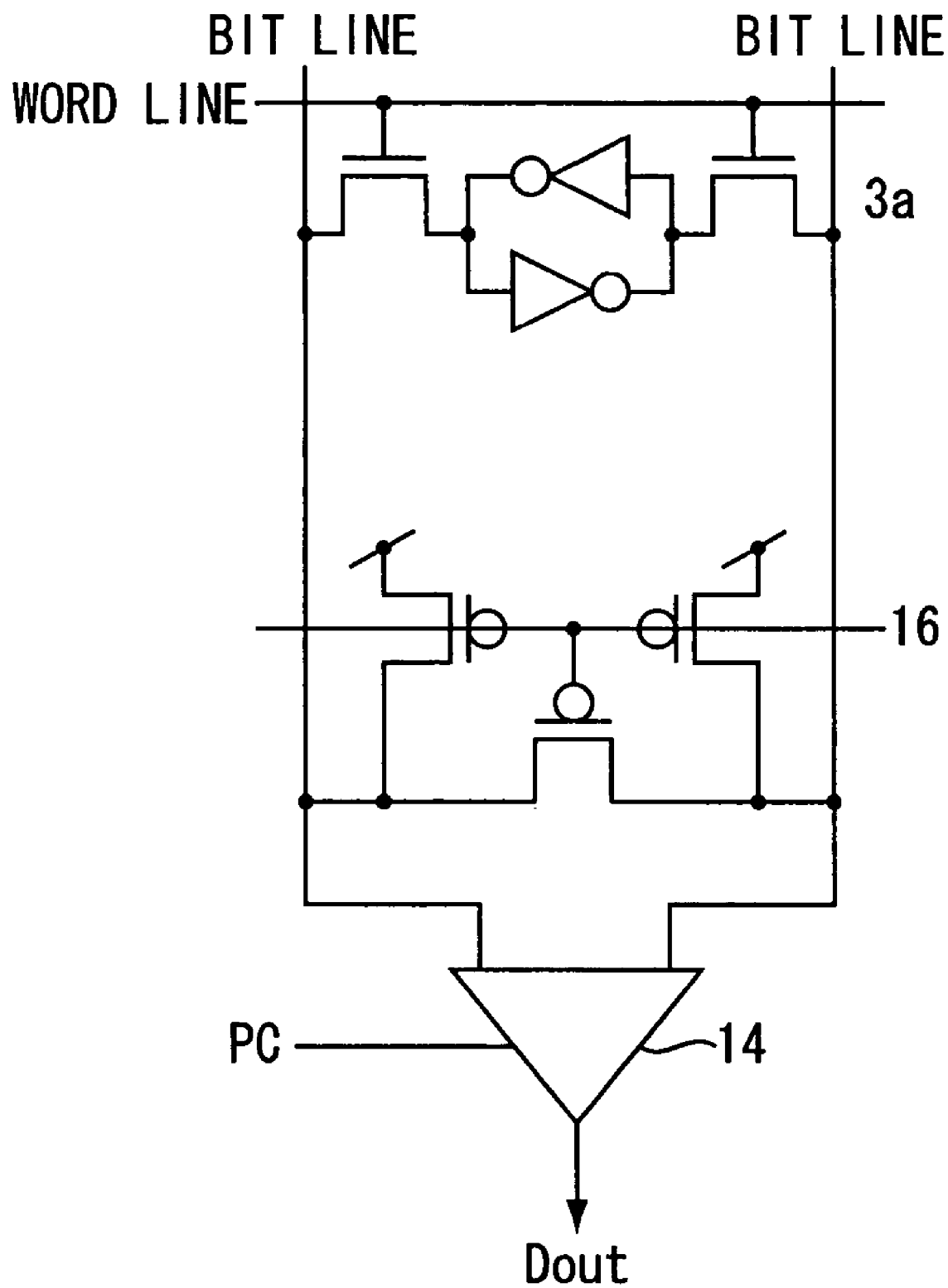
FIG. 2 shows a detailed structure of a memory cell, a precharge circuit, and a sense amplifier.

FIG. 2 shows relationship among one memory cell 3a constituting the memory cell array 3, a precharge circuit 16 to precharge a bit line, and a sense amplifier 14. When the row address signal drives the word line, two FETs turn on. Data from a memory element is output to two bit lines. The sense amplifier 14 amplifies data on the bit line selected by the column address. The sense amplifier 14 outputs this data as output data Dout.

Figure 3:
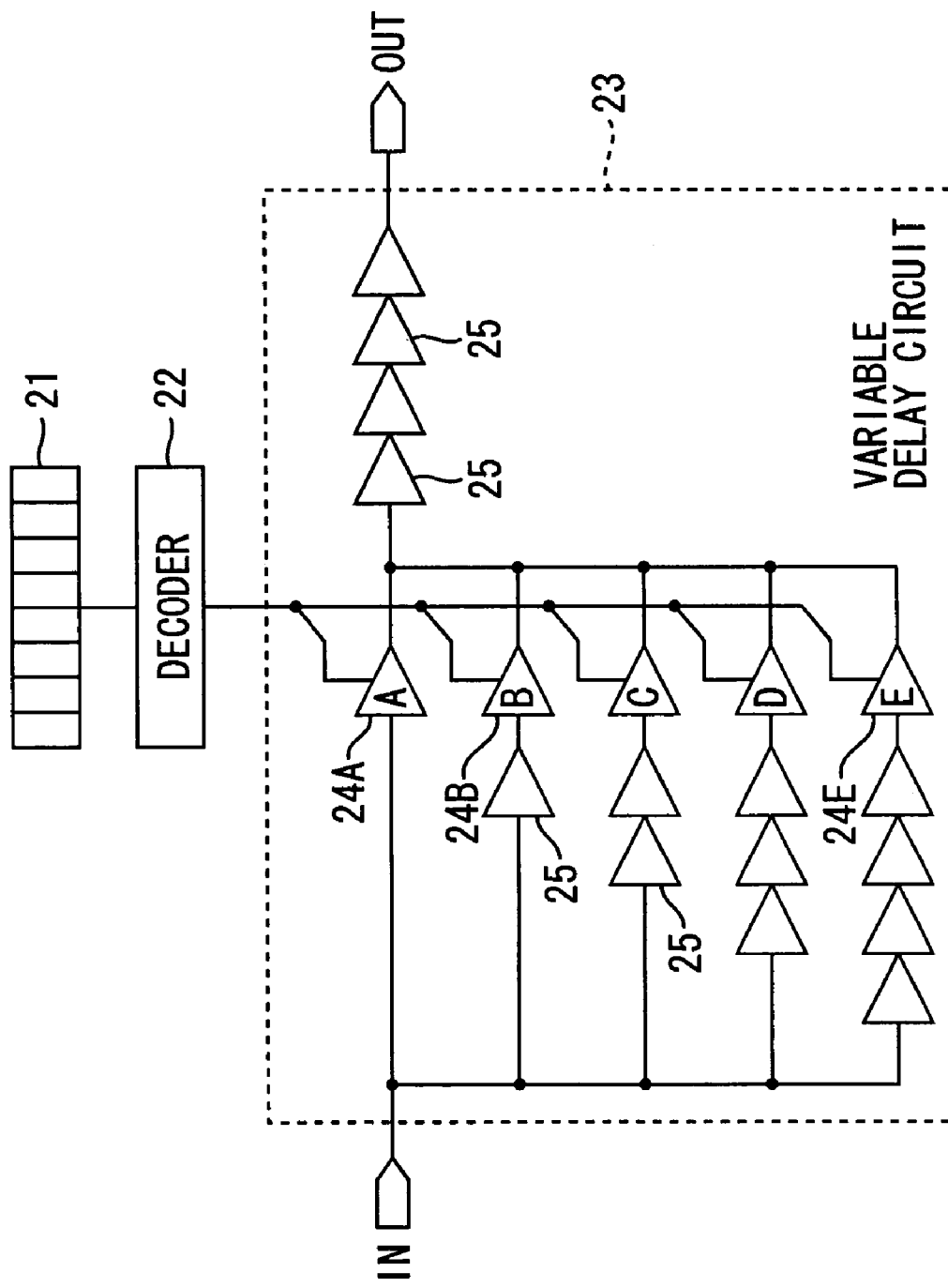
FIG. 3 is a circuit diagram showing a detailed configuration of a delay circuit.

FIG. 3 is a circuit diagram showing a configuration of a delay circuit as a basis for the delay control circuits 10 and 13. In FIG. 3, the reference numeral 21 represents an internal register capable of being rewritten by an external CPU (central processing unit), 22 a decoder to decode outputs from the register 21, and 23 a variable delay circuit. In the variable delay circuit 23, the reference numerals 24A through 24E represent tri-state buffers. Only one of these buffers becomes active in accordance with output from the decoder 22. The reference numeral 25 represents an amplifier (delay gate) comprising an even number of serially connected inverters.

In this configuration, when the tri-state buffer 24A becomes active, a signal from an input terminal IN is output via the tri-state buffer 24A. When the tri-state buffer 24B becomes active, the signal from the input terminal IN is delayed by one amplifier 25, and then is output via the tri-state buffer 24B. When the tri-state buffer 24C becomes active, the signal from the input terminal IN is delayed by two amplifiers, and then is output via the tri-state buffer 24C. Likewise, when the tri-state buffer 24D or 24E becomes active, the signal from the input terminal IN is delayed by three or four amplifiers, and then is output via the tri-state buffer 24D or 24E. In this manner, the delay circuit in FIG. 3 can change the delay amount using control data registered in the register 21.

Namely, the delay circuit 23 comprises a plurality of delay lines, each delay line comprising a different number of amplifiers 25 connected in series to define a different delay amount, and a selector 24 for selecting one of the delay lines according to the registered control data so that the selected delay line is used to delay the write signal.

Figure 4:
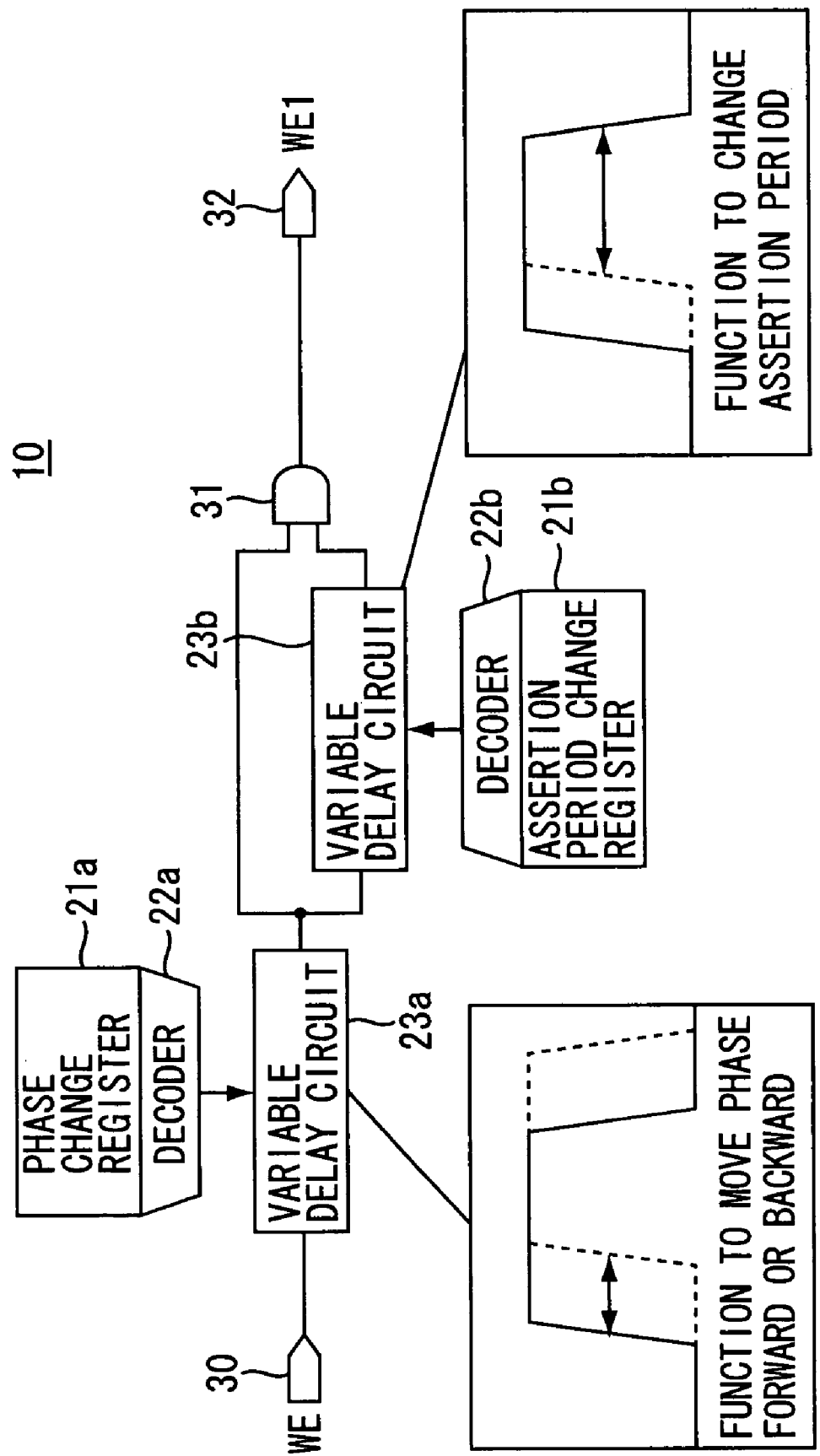
FIG. 4 is a block diagram showing a configuration of a write delay control circuit according to the embodiment.

FIG. 4 is a block diagram showing a configuration of the delay control circuit 10 comprising the above-mentioned delay circuit. In FIG. 4, the reference numeral 30 represents a terminal where the write signal WE is input. The reference numerals 21a, 22a, and 23a represent circuits having the same configurations as the register 21, the decoder 22, and the variable delay circuit 23 in FIG. 3, respectively. Likewise, the reference numerals 21b, 22b, and 23b represent circuits having the same configurations as the register 21, the decoder 22, and the variable delay circuit 23 in FIG. 3, respectively. The write signal WE input to the terminal 30 is delayed by the variable delay circuit 23a, and then is supplied to a first input terminal of an AND gate 31 and to an input terminal of the variable delay circuit 23b. The variable delay circuit 23b further delays the input signal and supplies it to a second input terminal of the AND gate. The AND gate 31 AND-gates the outputs from the variable delay circuits 23a and 23b with each other, and then outputs the AND-gated result as a write signal WE1 from a terminal 32.

In this configuration, the variable delay circuit 23a delays the write signal WE for a specified time period, i.e., delay amount. In other words, the variable delay circuit 23a outputs the write signal WE by controlling the phase. The variable delay circuit 23b and the AND gate 31 produce a write signal phase-controlled by the variable delay circuit 23a for controlling an assertion duration. That is to say, the write signal WE allows its phase and assertion duration to be controlled on the basis of data in the registers 21a and 21b, and then is output to the write amplifier 11. The write amplifier 11 outputs the write data Din to the bit line of the memory cell array 3 at the timing of the signal WE1 via the I/O circuit 6.

Namely, the control circuit 10 comprises a register 21a capable of registering control data from an outside for setting the delay amount, and a delay circuit 23a for delaying the write signal WE by the set delay amount and outputting the delayed write signal WE1 to the write circuit. The control circuit further comprises another register 21b capable of registering control data from an outside for determining an assertion duration of the write signal WE, and an assertion setting circuit composed of another delay circuit 23b and an AND gate 31 for setting the assertion duration of the write signal WE according to the registered control data so that the write circuit is activated for writing the data during the set assertion duration.

Figure 5:
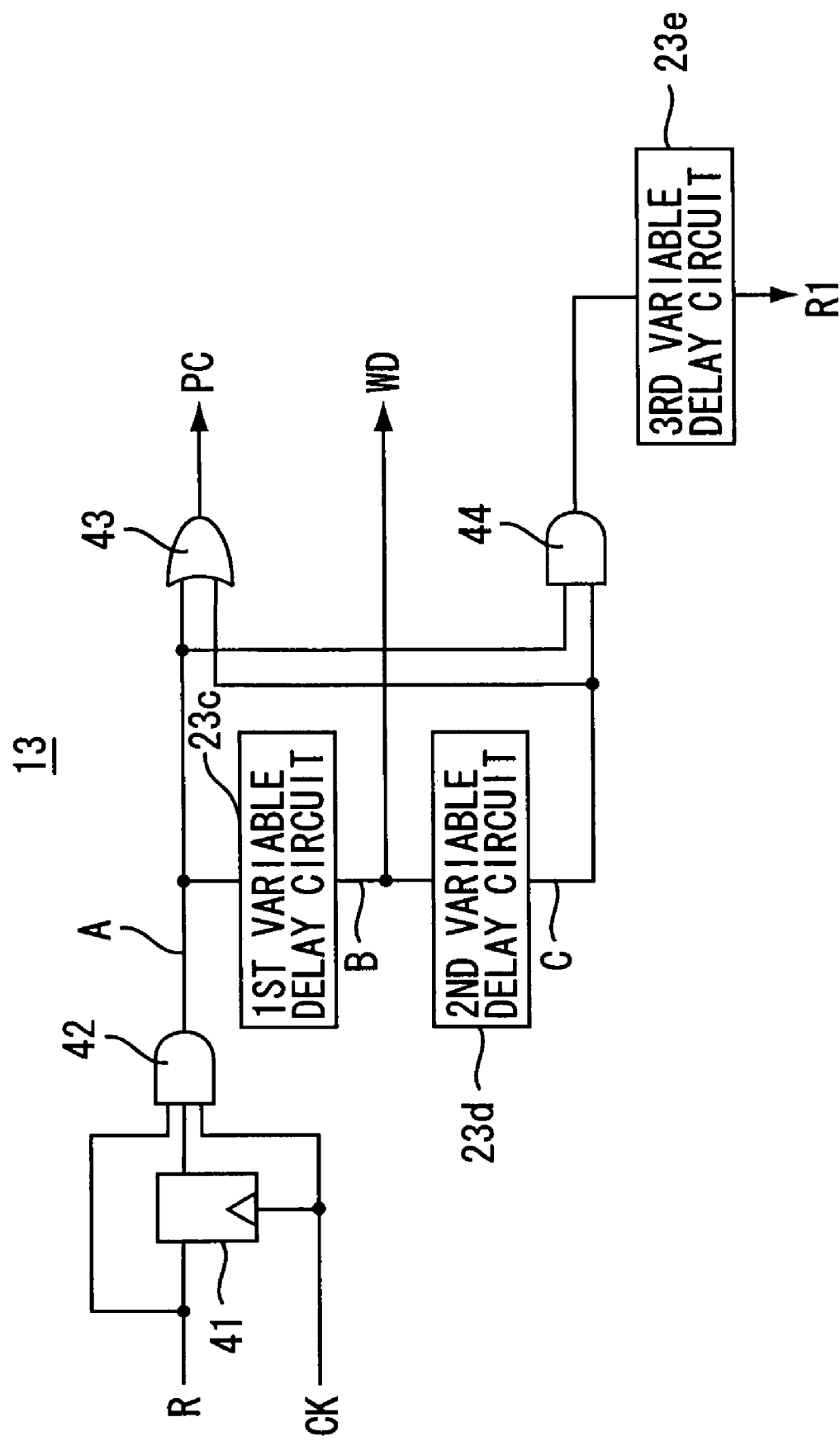
FIG. 5 is a block diagram showing a configuration of a read delay control circuit according to the embodiment.

FIG. 5 is a block diagram showing a configuration of the delay control circuit 13. In FIG. 5, the reference symbol R represents a read signal, and CK a clock pulse. The reference numeral 41 represents a D-FF (delay flip-flop) that takes the read signal R at a rising edge of the clock pulse CK and outputs the read signal R to an AND gate 42. The AND gate 42 AND gates the read signal R, an output from the D-FF 41, and the clock pulse CK with each other, and then outputs the AND-gated result as a read signal A. The reference numerals 23c, 23d, and 23e represent variable delay circuits having the same configuration as the variable delay circuit 23 in FIG. 3. Though not shown in FIG. 5, each of the variable delay circuits 23c through 23e is correspondingly provided with the register 21 and the decoder 22 shown in FIG. 3. The reference numeral 43 represents an OR gate that generates an output by OR-gating the output A from the AND gate 42 with an output C from the variable delay circuit 23d. The reference numeral 44 represents an AND gate that generates an output to the variable delay circuit 23e by AND-gating the output A from the AND gate 42 with the output C from the variable delay circuit 23d.

Figure 6:
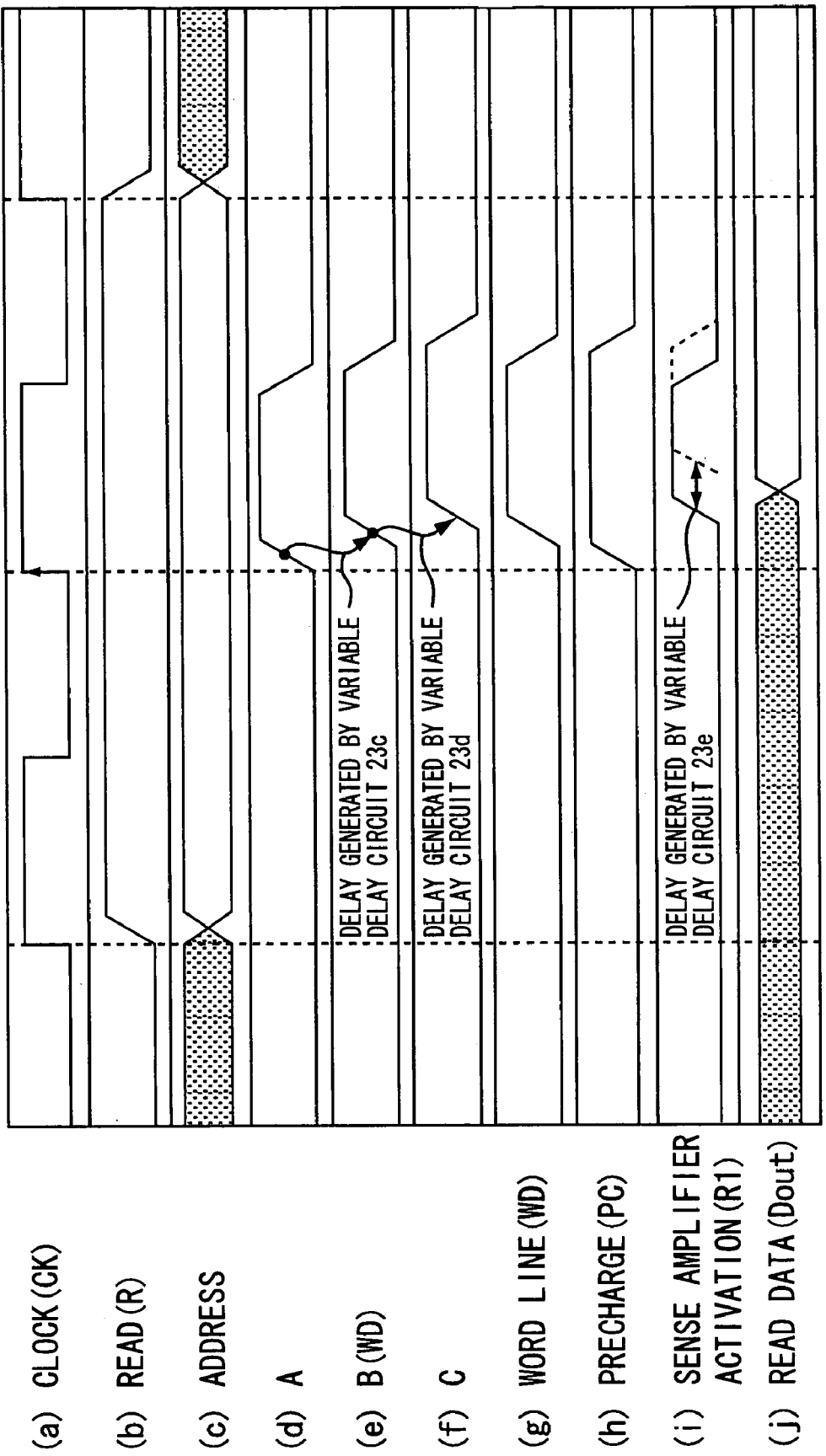
FIG. 6 is a timing chart explaining operations of the read delay control circuit.

The following describes operations of the delay control circuit 13 with reference to a timing chart of FIG. 6. The read signal R (FIG. 6(b)) rises first. At the same time, the address signal (FIG. 6(c)) is read into the row address buffer 1 and the column address buffer 4. When the next clock pulse CK (FIG. 6(a)) rises, the output signal (FIG. 6(d)) from the AND gate 42 rises. When the signal A rises, the output from the OR gate 43 rises and is output as a precharge signal PC (FIG. 6(h)) to the memory cell array 3. This signal precharges each bit line of the memory cell array 3. The signal A rises to raise the output signal B (FIG. 6(e)) from the variable delay circuit 23c after lapse of the delay time for the circuit 23c from that rise point. The output signal B is output as a word line signal WD (FIG. 6(g)) to the row address decoder 2. At the timing of this word line signal WD, an output from the row address decoder 2 is applied to each word line of the memory cell array 3.

The output signal B from the variable delay circuit 23c rises to raise the output signal C (FIG. 6(f)) from the variable delay circuit 23d after lapse of the delay time for the circuit 23d from that rise point. This raises an output from the AND gate 44. The output signal from the AND gate 44 rises to raise an output signal from the variable delay circuit 23e after lapse of the delay time set for the circuit 23e from that rise point. The output signal is output as a sense amplifier activation signal R1 (FIG. 6(i)) to the sense amplifier 14. This activates the sense amplifier 14 to output read data Dout (FIG. 6(j)).

The clock pulse CK falls to lower the signal A. The signal A falls to lower the output signal from the AND gate 44. After lapse of the delay time set for the variable delay circuit 23e, the sense amplifier activation signal R1 falls to inactivate the sense amplifier 14 again. Further, the signal A falls to lower the signal B (word line signal WD) after lapse of the delay time set for the variable delay circuit 23c. The signal B falls to lower the signal C after lapse of the delay time set for the variable delay circuit 23d. The signal C rises to raise the precharge signal PC.

Namely, the control circuit 13 comprises an OR gate circuit 43, an AND gate circuit 44 and variable delay circuits including a first delay circuit 23c, a second delay circuit 23d and a third delay circuit 23e. The first delay circuit 23c initially delays the read signal A and outputs the initially delayed read signal B as a word signal WD for the memory cell. The second delay circuit 23d is connected in series to the first delay circuit 23c for subsequently delaying the initially delayed read signal B and outputting the subsequently delayed read signal C. The OR gate circuit 43 has an input terminal for receiving the read signal A, another input terminal for receiving the subsequently delayed read signal C, and an output terminal for feeding an OR-gated read signal as a precharge signal PC to the memory cell. The AND gate circuit 44 has an input terminal for receiving the read signal A, another input terminal for receiving the subsequently delayed read signal C and an output terminal for feeding an AND-gated read signal having a given assertion duration such that the AND gate circuit 44, the first delay circuit 23c and the second delay circuit 23d constitute an assertion setting circuit for setting the assertion duration of the read signal A so that the read circuit is activated for reading the data during the assertion duration. The third delay circuit 23e is connected to the output terminal of the AND gate circuit 44 for finally delaying the AND-gated read signal by the set delay amount such that the third delay circuit 23e constitutes the delay circuit for delaying the read signal A by the set delay amount and outputting the finally delayed read signal R1 to the read circuit.

FIG. 7 explains effects of the above-mentioned embodiment. In FIG. 7(a), the sense amplifier is activated before the bit line potential reaches a differential input sensitivity of the sense amplifier, making it impossible to read a correct value. In FIG. 7(b), by contrast, the sense amplifier is activated after the bit line potential reaches a differential input sensitivity of the sense amplifier, making it possible to read a correct value.

According to the above-mentioned embodiment, the variable delay circuits 23c through 23e can be used to freely set the timing to generate the sense amplifier activation signal R1. This makes it possible to generate the sense amplifier activation signal R1 at the timing as shown in FIG. 7(b).

In this manner, the above-mentioned embodiment can repair a chip rejected due to a timing error so as to be provided as acceptable products by using an initialization program to rewrite the register at the LSI startup time. The initialization program may be configured before shipment of the LSI containing nonvolatile memory such as flash memory.

The above-mentioned embodiment uses the delay control circuits 10 and 13 as shown in FIGS. 4 and 5, respectively. For example, the circuit in FIG. 4 may be used for the delay control circuit 13. Further, the circuit in FIG. 5 may be used for the delay control circuit 10.

While the above-mentioned embodiment has described the writable/readable semiconductor memory device, the present invention may be also applied to read-only semiconductor memory devices.

In case of the writable/readable semiconductor memory device, the delay means may be provided for both or one of the writing and reading sides.

As mentioned above, the present invention can change an access timing in the semiconductor memory device by rewriting the internal register. This makes it possible to repair a defective chip rejected due to a timing error after completion of the chip, so that the repaired chip can be provided as acceptable products, thus improving the yield. Further, the present invention can electrically change the number of delay circuit stages. Consequently, it is possible to easily analyze semiconductor memory device errors.

What is claimed is:

1. A semiconductor memory device comprising:
   an array of memory cells that is provided for memorizing data;
   an address circuit responsive to an address signal inputted from an external source for addressing a memory cell in the array;
   a write circuit responsive to a write signal inputted from an external source for writing the data into the addressed memory cell; and
   a control circuit that is provided for delaying an input timing of the write signal to the write circuit by a given delay amount so as to adjust a timing of writing the data after addressing the memory cell, wherein
   the control circuit comprises a first register capable of registering control data from an external source for setting the delay amount, a delay circuit for delaying the write signal by the set delay amount and outputting the delayed write signal to the write circuit, a second register capable of registering control data from an external source for determining an assertion duration of the write signal, and an assertion setting circuit for setting the assertion duration of the write signal according to the registered control data so that the write circuit is activated for writing the data during the set assertion duration.

2. A semiconductor memory device comprising:
   an array of memory cells that is provided for memorizing data;
   an address circuit responsive to an address signal inputted from an external source for addressing a memory cell in the array;
   a write circuit responsive to a write signal inputted from an external source for writing the data into the addressed memory cell; and
   a control circuit that is provided for delaying an input timing of the write signal to the write circuit by a given delay amount so as to adjust a timing of writing the data after addressing the memory cell, wherein
   the control circuit includes a first register capable of registering control data from an external source for setting the delay amount, a delay circuit for delaying the write signal by the set delay amount and outputting the delayed write signal to the write circuit, and the delay circuit includes a plurality of delay lines, each delay line including a different number of amplifiers connected in series to define a different delay amount, and a selector for selecting one of the delay lines according to the registered control data so that the selected delay line is used to delay the write signal.

3. The semiconductor memory device according to claim 1, wherein the delay circuit includes a plurality of delay lines, each delay line including a different number of amplifiers connected in series to define a different delay amount, and a selector for selecting one of the delay lines according to the registered control data so that the selected delay line is used to delay the write signal.

4. A semiconductor memory device comprising:
   an array of memory cells that memorizes data;
   an address circuit responsive to an address signal inputted from an external source for addressing a memory cell in the array;
   a read circuit responsive to a read signal inputted from an external source for reading the data from the addressed memory cell; and
   a control circuit for delaying an input timing of the read signal to the read circuit by a given delay amount so as to adjust a timing of reading the data after addressing the memory cell, wherein
   the control circuit includes a register capable of registering control data from an external source for setting the delay amount, a delay circuit for delaying the read signal by the set delay amount and outputting the delayed read signal to the read circuit, and a second register capable of registering control data from an external source for determining an assertion duration of the read signal, and an assertion setting circuit for setting the assertion duration of the read signal according to the registered control data so that the read circuit is activated for reading the data during the set assertion duration.

5. The semiconductor memory device according to claim 4, wherein the delay circuit includes a plurality of delay lines, each delay line including a different number of amplifiers connected in series to define a different delay amount, and a selector for selecting one of the delay lines according to the registered control data so that the selected delay line is used to delay the read signal.

6. The semiconductor memory device according to claim 4, wherein the control circuit includes an OR gate circuit, an AND gate circuit and variable delay circuits including a first delay circuit, a second delay circuit and a third delay circuit, the first delay circuit initially delaying the read signal and outputting the initially delayed read signal as a word signal for the memory cell, the second delay circuit being connected in series to the first delay circuit for subsequently delaying the initially delayed read signal and outputting the subsequently delayed read signal, the OR gate circuit having an input terminal for receiving the read signal, another input terminal for receiving the subsequently delayed read signal, and an output terminal for feeding an OR-gated read signal as a precharge signal to the memory cell, the AND gate circuit having an input terminal for receiving the read signal, another input terminal for receiving the subsequently delayed read signal and an output terminal for feeding an AND-gated read signal having a given assertion duration such that the AND gate circuit, the first delay circuit and the second delay circuit constitute an assertion setting circuit for setting the assertion duration of the read signal so that the read circuit is activated for reading the data during the assertion duration, the third delay circuit being connected to the output terminal of the AND gate circuit for finally delaying the AND-gated read signal by the set delay amount such that the third delay circuit constitutes the delay circuit for delaying the read signal by the set delay amount and outputting the finally delayed read signal to the read circuit.

7. A semiconductor memory device comprising:
an array of memory cells that memorizes data;
an address circuit responsive to an address signal inputted from an external source for addressing a memory cell in the array;
a read circuit responsive to a read signal inputted from an external source for reading the data from the addressed memory cell; and
a control circuit for delaying an input timing of the read signal to the read circuit by a given delay amount so as to adjust a timing of reading the data after addressing the memory cell, wherein
the control circuit includes a register capable of registering control data from an external source for setting the delay amount, and a delay circuit for delaying the read signal by the set delay amount and outputting the delayed read signal to the read circuit, the delay circuit including a plurality of delay lines, each delay line comprising a different number of amplifiers connected in series to define a different delay amount, and a selector for selecting one of the delay lines according to the registered control data so that the selected delay line is used to delay the read signal.

8. A semiconductor memory device comprising:
an array of memory cells that memorizes data;
an address circuit responsive to an address signal inputted from an external source for addressing a memory cell in the array;
a read circuit responsive to a read signal inputted from an external source for reading the data from the addressed memory cell; and
a control circuit for delaying an input timing of the read signal to the read circuit by a given delay amount so as to adjust a timing of reading the data after addressing the memory cell, wherein
the control circuit includes a register capable of registering control data from an external source for setting the delay amount, a delay circuit for delaying the read signal by the set delay amount and outputting the delayed read signal to the read circuit, and an OR gate circuit, an AND gate circuit and variable delay circuits including a first delay circuit, a second delay circuit and a third delay circuit, the first delay circuit initially delaying the read signal and outputting the initially delayed read signal as a word signal for the memory cell, the second delay circuit being connected in series to the first delay circuit for subsequently delaying the initially delayed read signal and outputting the subsequently delayed read signal, the OR gate circuit having an input terminal for receiving the read signal, another input terminal for receiving the subsequently delayed read signal, and an output terminal for feeding an OR-gated read signal as a precharge signal to the memory cell, the AND gate circuit having an input terminal for receiving the read signal, another input terminal for receiving the subsequently delayed read signal and an output terminal for feeding an AND-gated read signal having a given assertion duration such that the AND gate circuit, the first delay circuit and the second delay circuit constitute an assertion setting circuit for setting the assertion duration of the read signal so that the read circuit is activated for reading the data during the assertion duration, the third delay circuit being connected to the output terminal of the AND gate circuit for finally delaying the AND-gated read signal by the set delay amount such that the third delay circuit constitutes the delay circuit for delaying the read signal by the set delay amount and outputting the finally delayed read signal to the read circuit.

9. A method of a controlling semiconductor memory device having an array of memory cells for memorizing data, an address circuit responsive to an address signal inputted from an external source for addressing a memory cell in the array, and a write circuit responsive to a write signal inputted from an external source for writing the data into the addressed memory cell, the method comprising:
registering control data into an internal register from an external source for setting an optimal delay amount;
registering control data from an external source for determining an assertion duration of the write signal;
setting the assertion duration of the write signal according to the registered control data so that the write circuit is activated for writing the data during the set assertion duration;
setting the optimal delay amount to an internal delay circuit according to the registered control data; and
outputting the write signal delayed by the set delay amount from the internal delay circuit to the write circuit so as to adjust a timing of writing the data after addressing the memory cell.

10. A method of a controlling semiconductor memory device having an array of memory cells for memorizing data, an address circuit responsive to an address signal inputted from an external source for addressing a memory cell in the array, and a write circuit responsive to a write signal inputted from an external source for writing the data into the addressed memory cell, the control method comprising:
registering control data into an internal register from an external source for setting an optimal delay amount;
registering control data from an external source for determining an assertion duration of the write signal;
reading a read signal inputted from an external source for reading the data from the addressed memory cell;
setting the assertion duration of the write signal according to the registered control data so that the write circuit is activated for writing the data during the set assertion duration;
setting the optimal delay amount to an internal delay circuit according to the registered control data; and
outputting the write signal delayed by the set delay amount from the internal delay circuit to the write circuit so as to adjust a timing of writing the data after addressing the memory cell.

* * * * *